United States Patent
Draper

(12) 
(10) Patent No.: US 6,486,075 B1
(45) Date of Patent: Nov. 26, 2002

(54) ANISOTROPIC WET ETCHING METHOD

(75) Inventor: Clifton Walk Draper, Hopewell, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/559,494

(22) Filed: Apr. 27, 2000

(51) Int. Cl.$^7$ ............................................. H01L 21/469
(52) U.S. Cl. ...................................................... 438/756
(58) Field of Search ................. 438/745, 756

(56) References Cited

U.S. PATENT DOCUMENTS 5,585,069 A  * 12/1996  Zanzucchi et al. .......... 422/100
5,755,947 A  *  5/1998  McElhanon et al. ........ 205/118
5,851,928 A  * 12/1998  Cripe et al. ................. 438/748

* cited by examiner

Primary Examiner—Benjamin L. Utech
Assistant Examiner—Matthew Anderson
(74) Attorney, Agent, or Firm—Lowenstein Sandler PC

(57) ABSTRACT

The present applicant has discovered that the application of an etch-rate reducing liquid that selectively wets the mask can permit anisotropic wet etching. In a preferred embodiment, the application of a hydrocarbon liquid film to a masked silica surface permits wet etching of straight silica walls without undercutting the mask. It is believed that the oil selectively wets the polymer mask, but not the silica surface. The oil will thus be selectively present at the point where the mask meets the silica. Since the HF etchant does not dissolve the oil, the etching produces straight walls instead of undercutting the mask.

7 Claims, 4 Drawing Sheets

ANISOTROPIC WET ETCHING METHOD

FIELD OF THE INVENTION

This invention relates to methods of etching masked substrates and, in particular, to methods for wet etching masked substrates anisotropically to produce straight etch walls without undercutting.

BACKGROUND OF THE INVENTION

Etching of masked substrates is an important step in the fabrication of integrated circuits and optical devices. Integrated circuits are typically fabricated by forming a protective silica layer over a silicon workpiece, forming a patterned polymer resist mask over the silica by photolithographic techniques and etching away unmasked portions of the silica to permit further processing, e.g. doping, of the underlying silicon. Optical devices such as planner waveguide devices are often fabricated using similar techniques.

One of the early techniques for etching the unmasked silica was wet etching with hydrofluoric acid. Unfortunately wet etching techniques were usually isotropic in that they etched at substantially the same rate in all directions. Thus, in addition to etching down through the silica toward the silicon substrate, they would also etch laterally underneath the mask, undercutting the mask and restricting its ability to precisely define the regions to be etched.

In part to alleviate this problem of undercutting, dry etching techniques such as plasma etching and reactive ion etching have been developed. Plasma etching is the selective removal of material by reactive chemical species generated within a plasma glow discharge ambient. It has advantages of ease of operation, cleanliness and ease of control. In reactive ion etching (RIE), plasma etching is enhanced by attracting ions from the plasma onto the workpiece. The main advantage of RIE is that it proceeds primarily in the direction of impinging ions, etching relatively straight walls as distinguished from the undercut walls typically produced by isotropic wet etching and isotropic plasma etching.

Reactive ion etching, however, also has disadvantages. One disadvantage is that is tends to be non-uniform, both on a macroscale from one end of the workpiece to another, and on a microscale in the vicinity of fine features. Moreover, as microcircuit sizes shrink, RIE can also produce undercutting. Collisions with neutral atoms in the plasma can drive ions against the side walls of a trench being etched. Moreover the potentials used in RIE to accelerate ions can damage thin layers. Accordingly there is a need for an improved method of anisotropic etching.

SUMMARY OF THE INVENTION

The present applicant has discovered that the application of an etch-rate reducing liquid that selectively wets the mask can permit anisotropic wet etching. In a preferred embodiment, the application of a hydrocarbon liquid film to a masked silica surface permits wet etching of straight silica walls without undercutting the mask. It is believed that the oil selectively wets the polymer mask, but not the silica surface. The oil will thus be selectively present at the point where the mask meets the silica. Since the HF etchant does not dissolve the oil, the etching produces straight walls instead of undercutting the mask.

BRIEF DESCRIPTION OF THE DRAWINGS

The advantages, nature and various additional features of the invention will appear more fully upon consideration of the illustrative embodiments described in connection with the accompanying drawings. In the drawings.

It is to be understood that these drawings are for purposes of illustrating the concepts of the invention and, except for the graphs, are not to scale.

DETAILED DESCRIPTION

Figure 1A:
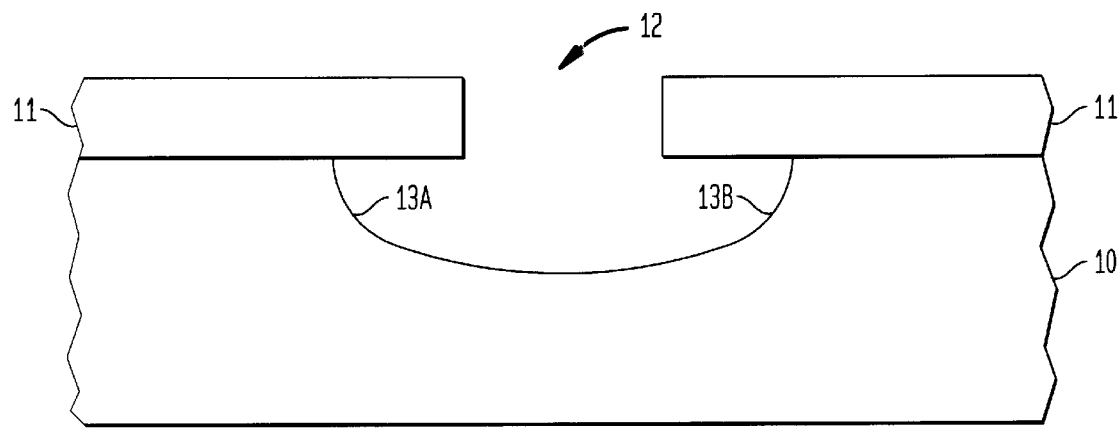
FIGS. 1A and 1B schematically illustrate isotropic and anisotropic etching, respectively.
Figure 1B:
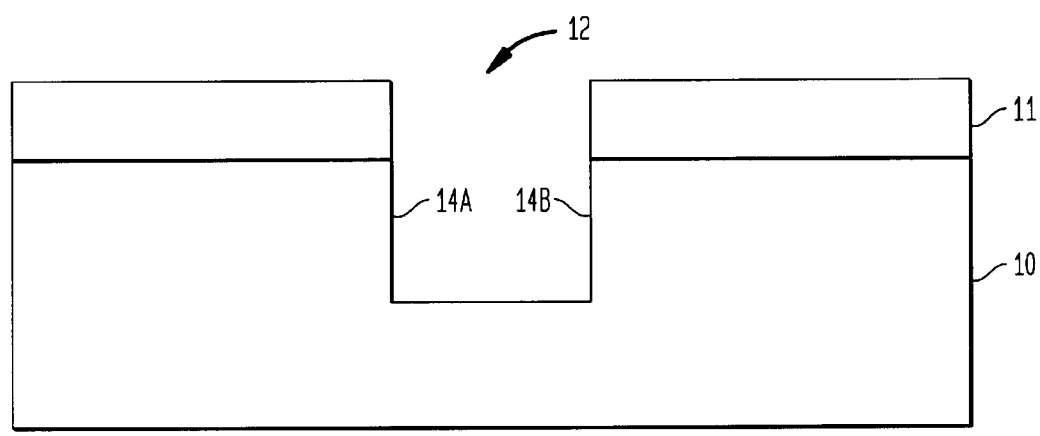

FIGS. 1A and 1B are schematic cross sections useful in understanding the problem to which the invention is directed. FIG. 1A illustrates a thin substrate layer 10 covered by a patterned etch mask 11. The layer 10 has been isotropically etched through an opening 12 in the mask. As can be seen, the etching removes material both in the vertical direction down from the mask and in the lateral direction undercutting the edge of the mask around opening 12. It is easy to see that once the mask is removed, the walls 13A, 13B of the etched substrate are sloped rather than vertical, limiting the precision with which a pattern can be etched in the substrate 10. Wet etching and undirected plasma etching of silica substrates is typically isotropic.

FIG. 1B illustrates a similar workpiece wherein the etching is anisotropic through the opening 12 into the substrate 10. Here there is little undercutting of the mask 11 and the walls 14A, 14B are substantially vertical. Reactive ion etching is typically anisotropic, but presents other disadvantages discussed above.

Figure 2:
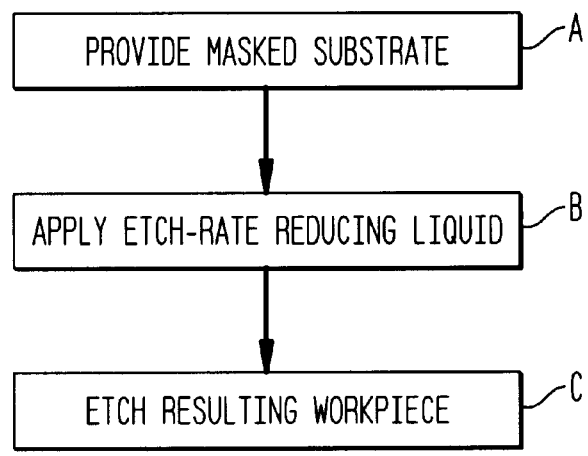
FIG. 2 is a schematic flow diagram illustrating the steps in anisotropic wet etching in accordance with the invention.

FIG. 2 is a schematic flow diagram showing the steps involved in anisotropic wet etching in accordance with the invention. The first step, shown in Block A, is to provide a masked substrate to be etched. Typically the masked substrate is a polymer resist masked semiconductor or glass such as a photoresist masked silicon substrate having a silica surface layer to be etched in accordance with a pattern photolithographically defined in the mask. Alternatively, the substrate can be lithium niobate or more complex glass. Such masked substrates can be made in the conventional manner and are well known in the art.

The next step, shown in Block B, is to apply to the surface of the masked substrate an etch-rate reducing liquid which wets the material of the mask but not the material of the substrate to be etched. In the typical case, the etch-rate reducing liquid will be a hydrocarbon oil. The oil is hydrophobic to $SiO_2$ but hydrophilic to polymer, so it wets the polymer, but not the $SiO_2$. Similarly, hydrocarbon oil would not wet lithium niobate or complex glass.

Figure 3:
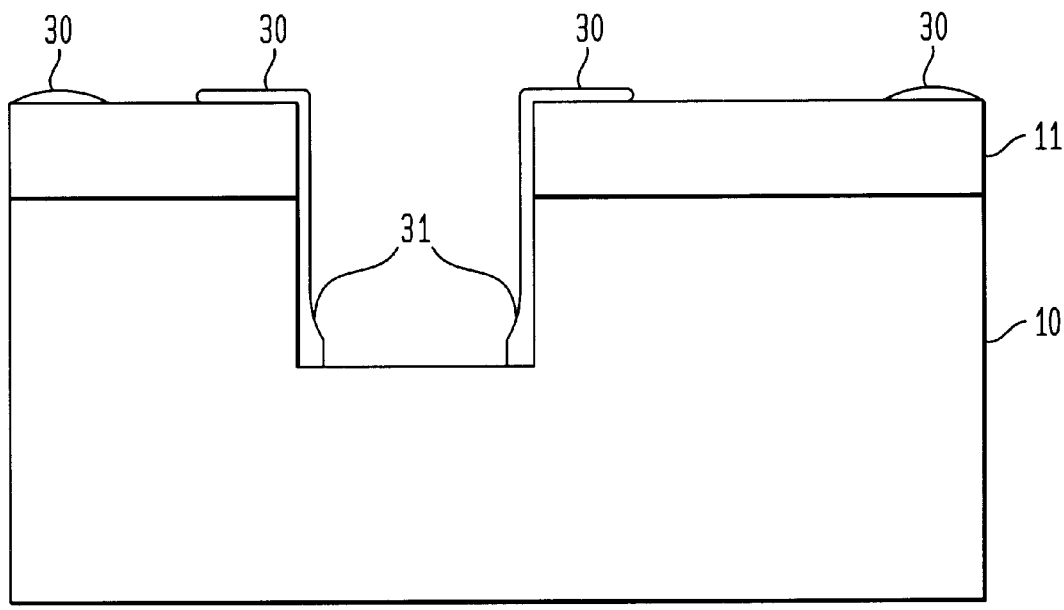
FIG. 3 schematically illustrates a masked substrate after application of an etch-rate reducing liquid.

FIG. 3 schematically illustrates the masked substrate after application of the etch-rate reducing liquid 30. The liquid wets the mask and forms a small etch-protective bead 31 along the mask-substrate boundary.

The third step (Block C), is to etch the masked substrate. The bead of etch-rate reducing material around the mask-substrate boundary converts an otherwise isotropic etch into an anisotropic etch. For example, a masked silica layer can thus be anistropically etched by a wet etch solution of hydrofluoric acid. The liquid boundary bead prevents undercutting and produces a straight wall etch. Oil beads would have a similar rate-reducing affect with other aqueous etchants.

The invention may now be more clearly understood by consideration of the following specific examples:

EXAMPLE 1

Bulk synthetic silica (Heraeus Amersil product code F300) was masked with strips of polymer from commercial hot "glue" gun. The strips are nominally 2 mm wide. Multiple samples are prepared. A subset of these pieces are coated with a hydrocarbon oil (Cargille product code 4550—an aliphatic and alicyclic hydrocarbon mixture). The samples are immersed in the oil and then placed on their edge so that excess oil flows down off the sample. They are allowed to "dry" for 15 minutes. All masked samples are then placed into the same teflon beaker containing 300 ml of etching solution. The etching solution is composed of 100 ml of 48% HF and 200 ml of Dl water. The solution was prepared earlier so that it has cooled back to room temperature by the time the glass samples are introduced. Samples are etched for 10 minutes.

Figure 4A:
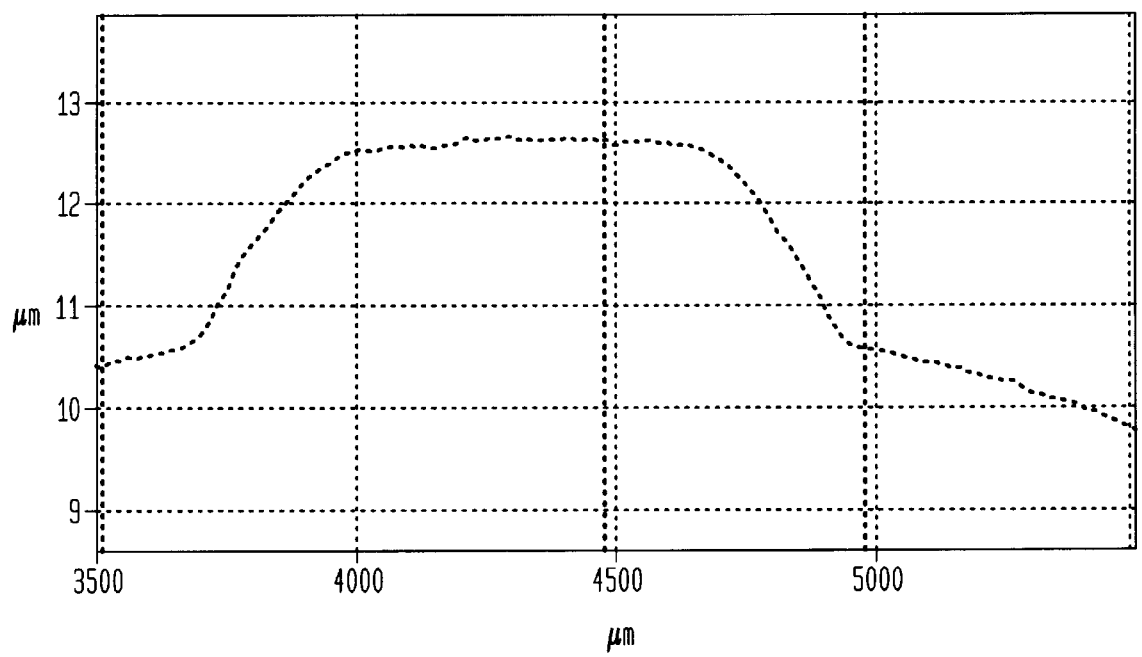
FIGS. 4A and 4B are surface profile measurements of workpiece surfaces conventionally wet etched and wet etched in accordance with a first example of the invention.
Figure 4B:
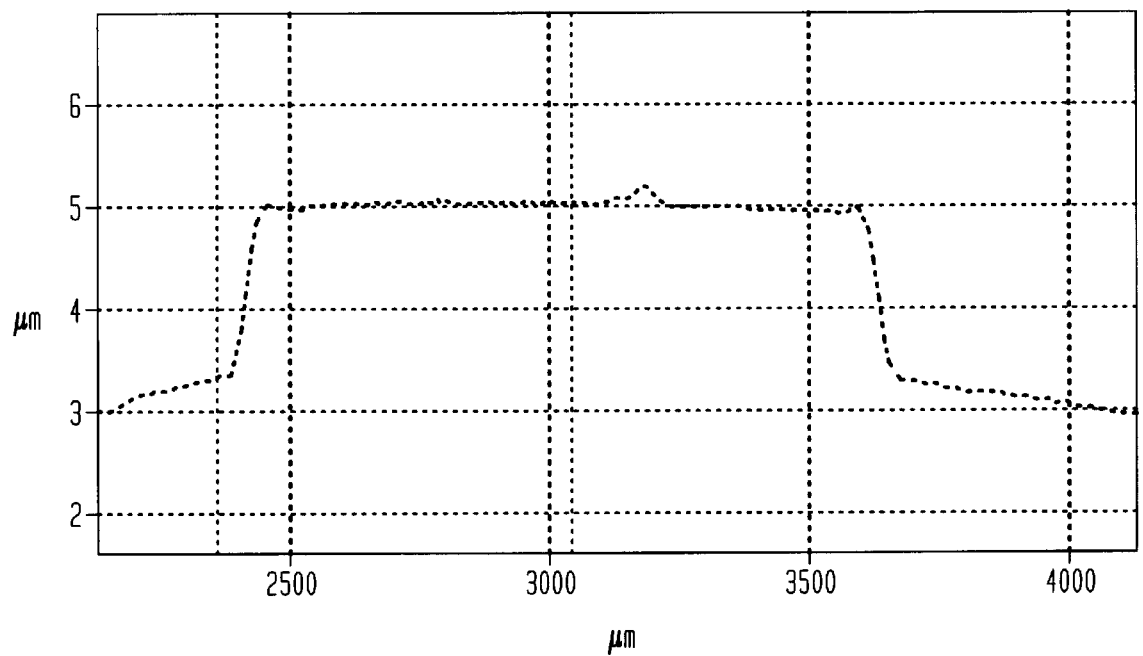

FIGS. 4A and 4B graph surface profilometer measurements of the mesas thus prepared. FIG. 4A shows the profilometer measurements for etching without oil. FIG. 4B shows the measurements with oil. In the case of the silica glass without oil the mesa sidewall is obviously isotropically etched in the way commonly observed and referred to as undercutting. In contrast the glass sample that was exposed to the oil has relatively straight sidewalls with little evidence of undercutting. Both samples were etched "down" to approximately the same depth of ~1.8 micrometers.

EXAMPLE 2

Single crystal silicon wafers with 6000 Å of thermal oxide grown on them were used as substrate. Samples roughly 1 inch square were scribed from the wafer. Again multiple glue gun strips of ~2 mm width were applied to each sample. Wafer pieces were immersed and allowed to drip dry by gravity when they were placed on their edges. Samples were etched in 300 ml of 1 part HF, 2 parts Dl water at room temperature for 5 minutes. This was sufficiently long to etch down to the single crystal silicon under the 6000 Å oxide film. Thus the mesa height is exactly the same with and without oil applied.

Figure 5A:
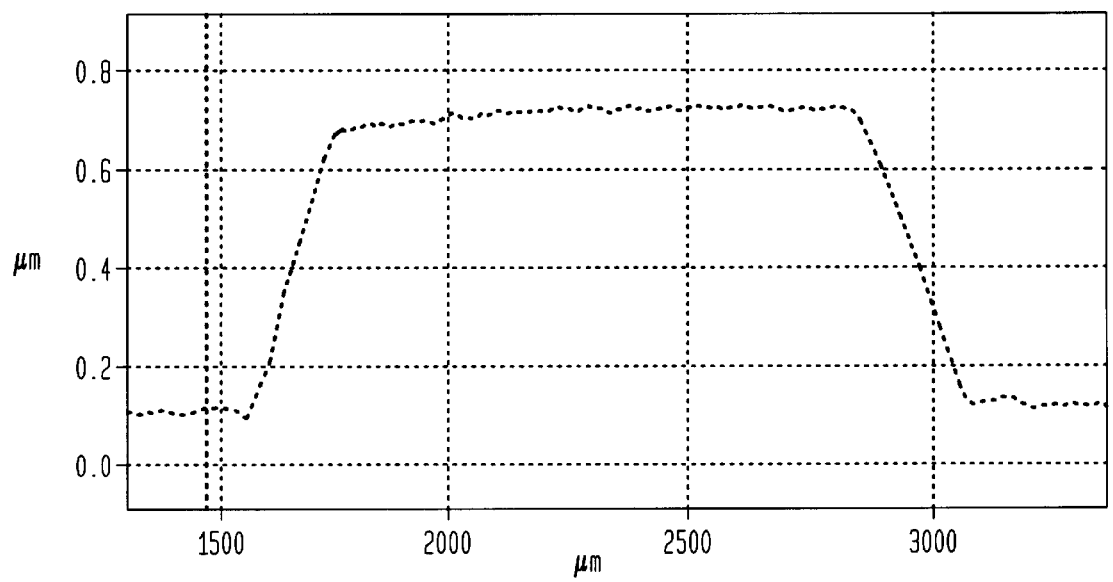
FIGS. 5A and 5B are surface profile measurements of workpiece surfaces conventionally wet etched and wet etched in accordance with a second example of the invention.
Figure 5B:
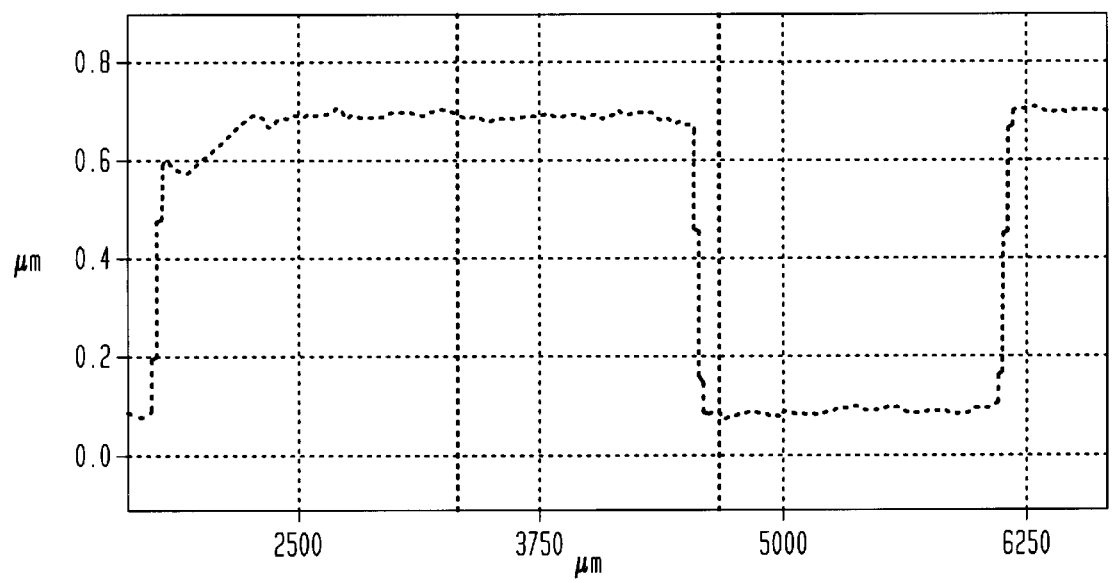

FIGS. 5A and 5B graph surface profilometer measurements of the mesas thus prepared. FIG. 5A is without oil. FIG. 5B is with oil. With oil the samples have more vertical walls, indicative of undercutting being "blocked."

Applicant's best current understanding of the theory underlying the invention is as follows. The hydrocarbon oil is hydrophobic to $SiO_2$ but hydrophilic to the polymer. Thus it wets the polymer, but not the $SiO_2$. So it forms a small bead along the border of the bottom of the polymer strip. The HF solution is mostly water, and the oil is immiscible in the solution. So when the glass is immersed in the HF, the oil bead does not move. It (the oil) does not mix into the water-based liquid. As the HF attacks the silica surface going down into the silica, the oil at the base of the polymer strip "thins" down maintaining a continuous oil boundary between the water, silica and polymer. It may also be that the natural tendency for the polymer strip to be "somewhat circular" even though sitting atop a flat surface makes it easy to confine a small quantity of oil at the critical juncture of the silica to the mask.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A method of anisotropically etching a masked substrate with an isotropic etchant comprising the steps of:
   providing a substrate of a first material masked for etching by a mask layer of a second material;
   applying to the masked substrate a liquid that
   1) wets the second material but not the first and
   2) reduces the rate of etching of material the liquid covers;
   permitting the liquid to form an etch-protective bead along the boundary between the mask and the substrate; and
   after forming the bead, etching the masked substrate with the isotropic etchant.

2. The method of claim 1 wherein the substrate comprises a layer of silica to be etched, the mask layer comprises a polymer, and the etch-rate reducing material comprises a liquid hydrocarbon oil.

3. The method of claim 2 wherein the isotropic etchant comprises an aqueous etchant.

4. The method of claim 2 wherein the isotropic etchant comprises hydrofluoric acid.

5. The method of claim 1 wherein the substrate comprises lithium niobate.

6. The method of claim 1 wherein the substrate comprises glass.

7. The method of claim 1 wherein the liquid etch-rate reducing material comprises hydrocarbon oil and the isotropic etchant comprises an aqueous etchant.

* * * * *